(12) United States Patent
Gouin et al.

(10) Patent No.: US 7,355,465 B2
(45) Date of Patent: Apr. 8, 2008

(54) DELAY CIRCUIT WITH ACCURATE TIME TO FREQUENCY CONVERSION

(75) Inventors: Vincent Gouin, Mandelieu (FR); Yann Tellier, Valbonne (FR)

(73) Assignee: Infineon Technologies AG, Munich (DE)

( * ) Notice: Subject to any disclaimer, the term of this patent is extended or adjusted under 35 U.S.C. 154(b) by 9 days.

(21) Appl. No.: 11/241,188

(22) Filed: Sep. 30, 2005

(65) Prior Publication Data

US 2006/0076996 A1 Apr. 13, 2006

(30) Foreign Application Priority Data

Sep. 30, 2004 (EP) .................................. 04023348

(51) Int. Cl.
*H03L 7/06* (2006.01)
(52) U.S. Cl. ...................................... 327/261; 327/270
(58) Field of Classification Search ........ 327/261–264, 327/270–271, 276–277, 284
See application file for complete search history.

(56) References Cited

U.S. PATENT DOCUMENTS

| | | | |
|---|---|---|---|
| 4,458,165 A | 7/1984 | Jackson | 327/276 |
| 5,572,149 A | 11/1996 | Fujii | 326/93 |
| 6,247,138 B1* | 6/2001 | Tamura et al. | 713/600 |
| 6,255,878 B1 | 7/2001 | Gauvin et al. | 327/263 |
| 6,754,112 B2* | 6/2004 | Ahn et al. | 365/194 |
| 6,812,756 B2* | 11/2004 | Starr | 327/157 |

FOREIGN PATENT DOCUMENTS

EP  1 096 666 A2  5/2001

\* cited by examiner

*Primary Examiner*—N. Drew Richards
*Assistant Examiner*—Thomas J. Hiltunen
(74) *Attorney, Agent, or Firm*—Patterson & Sheridan, L.L.P.

(57) ABSTRACT

A delay circuit comprises a signal generator and a delay component. The signal generator comprises a terminal for receiving a trigger signal and an output for outputting a signal when receiving a trigger signal with a pre-determined characteristic. The delay mean comprises an input for receiving the signal outputted by the signal generator and an output for generating a signal delayed with a delay referred to the time the delay mean received the signal outputted by the signal generator.

13 Claims, 4 Drawing Sheets

DELAY CIRCUIT WITH ACCURATE TIME TO FREQUENCY CONVERSION

CROSS-REFERENCE TO RELATED APPLICATIONS

This application claims foreign priority benefits under 35 U.S.C. §119 to co-pending European patent application number EP 04 023 348.8, filed 30 Sep. 2004. This related patent application is herein incorporated by reference in its entirety.

BACKGROUND OF THE INVENTION

1. Field of the Invention

The invention relates to a delay circuit and to a method of generating a signal with a delay.

2. Description of the Related Art

In order to confirm the functionality of chips before they are shipped, electronic testers are employed to test the functionality of each chip. One of the goals is to measure or to determine timings that characterize the performance of the device under test. An example of such timings are delay type timings, i.e., the propagation delay from an input to an output of the device under test. Access times of memories rank for example among delay type timings.

The characterization of timings of electronic components, especially if they are embedded in an integrated circuit, must achieve high accuracy, since the delay times of such circuits are very small and are in the order of a nanosecond. It is convenient, and it is a standard approach to make the integrated circuit oscillate in order to measure a frequency instead of a delay.

In order to make the integrate circuit oscillate, an inverting path is provided, which connects the output terminal of the integrated circuit to its input terminal. The oscillation cycle time obtained from this arrangement equals the sum of the rising and the falling delay. However, the rising and the falling delay may be different. A perfect equality of the rising and the falling paths cannot be guaranteed over all operation conditions because the rising and the falling delay, for instance, may depend on the local variations of the transistors. Ultimately, only the sum of the rising and falling delays can be measured, but not only one of them. The measurement thus suffers from an intrinsic inaccuracy which cannot be compensated.

SUMMARY OF THE INVENTION

Therefore it is an object of the present invention to provide a delay circuit producing a delay that is only due to a rising or a falling delay.

According to another object of the present invention the delay circuit comprises a feedback circuit that does not exhibit any signal inversion between the input and the output. The feedback circuit facilitates running the delay circuit in a cycle mode. According to a further object of the present invention, the oscillation period in the cycle mode equals the delay generated by the delay circuit in case the same parameters are used in cycle and delay mode.

In accordance with the present invention, a delay circuit comprises a signal generator and a delay means/component.

The signal generator can be fed with a trigger signal on its control terminal. When the signal generator receives a trigger signal exhibiting a pre-determined characteristic, the signal generator outputs a signal on its output terminal.

The signal generated by the signal generator is passed on to an input terminal of the delay means. The delay means imposes a time delay on this signal. This time delay can, for example, be programmed by the operator or it can be pre-determined and fixed. Thus, the delay means generates an output signal on its output terminal, with the output signal being delayed with the time delay referred to the time the delay means received the signal from the signal generator.

The pre-determined characteristic of the trigger signal can, for example, be a rising (or a falling) edge. This means that only if the signal generator receives a trigger signal exhibiting a rising edge, the signal generator will generate the signal on its output terminal, but the signal generator will not create such a signal if it receives a trigger signal exhibiting a falling edge (or vice versa).

Because of the arrangement of the delay circuit described above, it is possible to avoid that both a rising and a falling commutation of the trigger signal cause a delayed signal. Consequently, any difference between a rising and a falling delay does not affect the accuracy of the delay obtained, meaning that the delay can be determined very precisely.

The delay circuit according to the invention advantageously comprises a feedback circuit. The feedback circuit connects the output terminal of the delay means to the control terminal of the signal generator. The feedback circuit facilitates to run the delay circuit in a cycle mode. Since there is no signal inversion between the input and the output terminals, the delay generated is only the rising or the falling delay instead of the sum of both delays.

The oscillation period is identical to the delay produced by the delay circuit. Consequently, the oscillation period in the cycle mode equals the delay produced by the delay circuit in delay mode if the time delay is identical in delay and cycle mode. This is especially advantageous if the delay time is programmable. It is also useful when using a pre-determined and fixed delay time.

Advantageously, the signal generator generates pulses. The pulses can be of variable widths. That means that the signal generator resets its output terminal automatically after a certain time after the signal generator was triggered to produce a signal on its output terminal.

For example, the signal generator can be designed as a sample-and-hold means, which comprises a control terminal for receiving the trigger signal, an input terminal for sampling a pre-determined signal feeding this input terminal and an output terminal for outputting the pre-determined signal, which feeds the input terminal when the control terminal is fed with a trigger signal exhibiting the pre-determined characteristic.

For providing the sample-and-hold means with an auto-reset function, the sample-and-hold means favourably comprises a feedback circuit connecting its output terminal to a reset terminal of the sample-and-hold means. The reset terminal is configured in a way that it resets the output terminal of the sample-and-hold means when the reset terminal receives the pre-determined signal. Hence, every time the output terminal outputs the pre-determined signal, the output terminal is reset afterwards.

In order to generate a pulse of a certain width on the output terminal of the sample-and-hold means, the feedback circuit of the sample-and-hold means comprises a delay means. This causes the output terminal to be reset after a time determined by the delay means. The delay time of the delay means can advantageously be programmed.

A flip-flop is a sample-and-hold means that fulfils the conditions mentioned above.

In order to generate the delayed signal, the delay means advantageously comprises a plurality of delay stages connected in series. In particular, the delay stages impose coarse or fine delays on the signals feeding their input terminals, respectively.

In accordance with one advantageous configuration of the delay means according to the invention, the feedback circuit of the delay circuit comprises a multiplexer. The multiplexer comprises a first input terminal that is connected to the output terminal of the delay means, a second input terminal that can be fed with an input signal, and an output terminal that is connected to the control terminal of the signal generator. The multiplexer allows for operating the delay circuit selectively either in a delay mode or in a cycle mode. In the delay mode, the second input terminal of the multiplexer can, for example, be fed with a clock signal.

In order to switch between the delay mode and the cycle mode, the multiplexer comprises a control terminal that can be fed with a control signal. This configuration is shown in FIG. 1 and is later described as a first exemplary embodiment of the invention.

In accordance with another advantageous configuration of the delay circuit according to the invention, the delay circuit comprises an AND gate and an OR gate. The AND gate comprises a first input terminal fed with the input signal, a second input terminal connected to the control terminal of the multiplexer and an output terminal. The OR gate comprises a first input terminal connected to the output terminal of the AND gate, a second input terminal connected to the output terminal of the multiplexer and an output terminal connected to the control terminal of the signal generator. This configuration of the delay circuit is shown in FIG. 3 and is later described as a second exemplary embodiment of the invention.

In accordance with a further advantageous configuration of the delay circuit according to the invention, the AND gate of the delay circuit can be fed with a start/stop signal on its first input terminal. The second input terminal of the AND gate is connected to the control terminal of the multiplexer. The output terminal of the AND gate is connected to the first input terminal of the OR gate. The second input terminal of the OR gate is connected to the output terminal of the multiplexer and the output terminal of the OR gate is connected to the control terminal of the signal generator.

Advantageously, the start/stop signal on the first input terminal of the AND gate can be produced by a further sample-and-hold means. The further sample-and-hold means comprises a control terminal for receiving a reset signal, an input terminal for sampling a pre-determined signal feeding the input terminal and an output terminal for outputting the pre-determined signal when receiving the reset signal. The output terminal of the further sample-and-hold means is connected to the first input terminal of the AND gate. The further sample-and-hold means further comprises a feedback circuit connecting its output terminal with a reset terminal. The further sample-and-hold means is reset when receiving the pre-determined signal on its reset terminal. In order to program the delay after resetting the sample-and-hold means, a delay means is arranged in the feedback circuit of the sample-and-hold means.

The configuration of the delay circuit described above is shown in FIG. 4 and is later described as a third exemplary embodiment of the invention.

Advantageously, the pre-determined characteristic of the trigger signal feeding the control input of the signal generator is a rising or a falling edge of this signal.

Although the time delay generated by the delay means can be pre-determined and fixed, the time delay is advantageously programmable.

In accordance with the present invention, a method of generating an output signal with a time delay comprises the following steps:

(1) receiving a trigger signal;
(2) generating a signal if the received trigger signal exhibits a pre-determined signal characteristic; and
(3) generating an output signal delayed with a time delay referred to the time the signal was generated.

The method according to the invention has the same advantages over conventional methods of generating an output signal with a time delay as the delay circuit according to claim 1.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
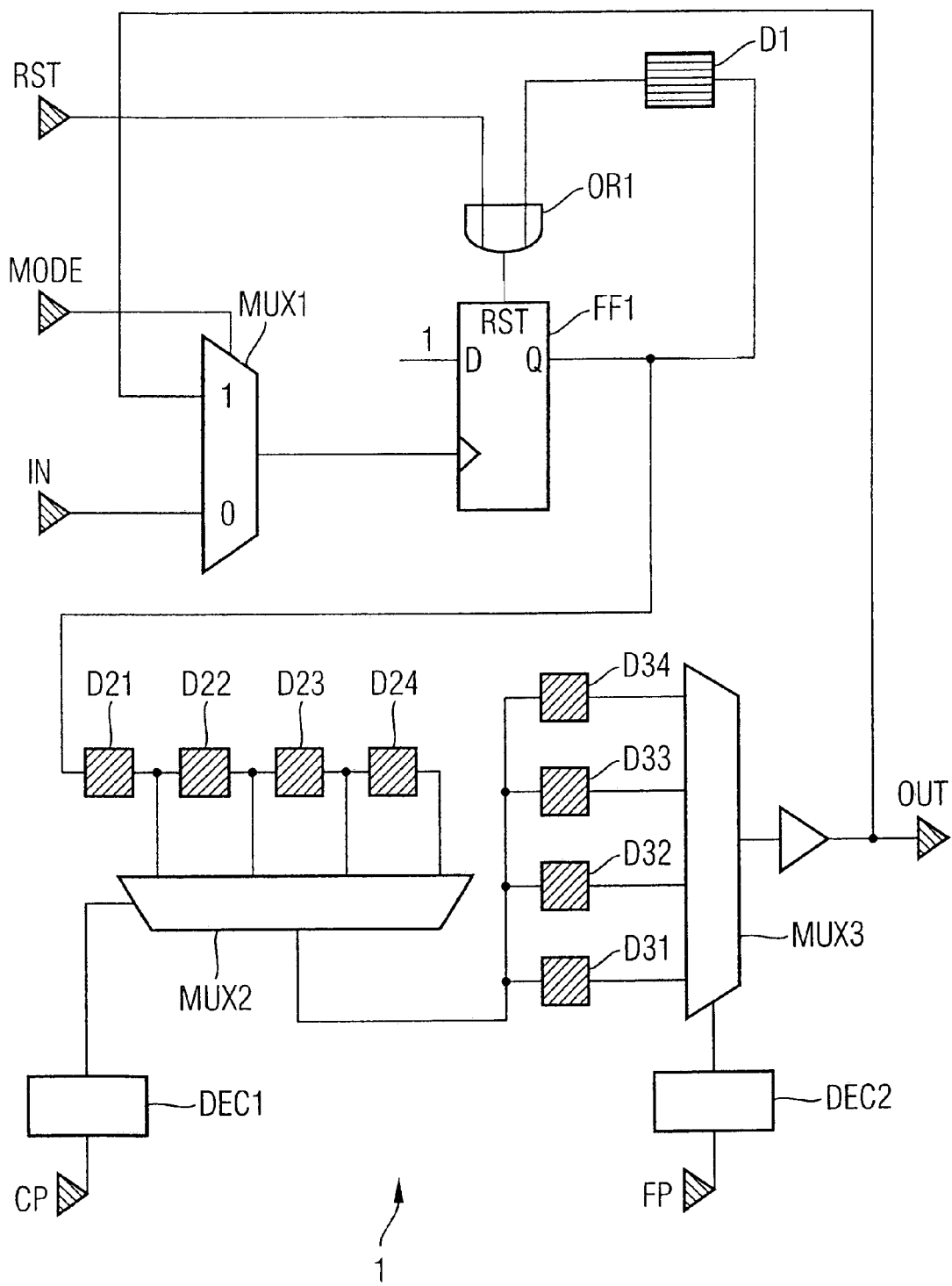
FIG. 1 shows a first exemplary embodiment of the delay circuit according to the invention.

FIG. 1 shows the circuit diagram of a programmable delay circuit 1 as a first exemplary embodiment of the invention.

A signal input IN of the programmable delay circuit 1 is connected to a first input of a multiplexer MUX1. The output of the multiplexer MUX1 is connected to the clock input of a flip-flop FF1. The control input of the multiplexer MUX1 is identical with a control input MODE of the programmable delay circuit 1.

The input D of the flip-flop FF1 is always on a logical high level. The output Q of the flip-flop FF1 feeds a first input of an OR gate OR1 via a non-inverting delay cell D1. The second input of the OR gate OR1 is identical with a control input RST of the programmable delay circuit 1. The output of the OR gate OR1 is connected to a reset terminal of the flip-flop FF1.

The output Q of the flip-flop FF1 also drives a programmable delay mean consisting of two delay stages, which are connected in series. The first delay stage comprises delay cells D21, D22, D23 and D24, which are connected in series. The four inputs of a multiplexer MUX2 are fed by the four outputs of the delay cells D21, D22, D23 and D24, respectively. The multiplexer MUX2 is controlled by a decoder DEC1 having a control input CP. The second delay stage comprises delay cells D31, D32, D33 and D34, which are connected in parallel and are fed by the output of the multiplexer MUX2. The outputs of the delay cells D31, D32, D33 and D34 are connected to the inputs of a multiplexer MUX3, respectively. The multiplexer MUX3 is controlled by a decoder DEC2, which has a control input FP.

The output of the multiplexer MUX3 feeds an output OUT of the programmable delay circuit 1. The output OUT feeds back into a second input of the multiplexer MUX1.

The method of operation of the programmable delay circuit 1 is described below.

The programmable delay circuit 1 can be operated in two different modes, i.e., a delay mode and a cycle mode.

Figure 2:
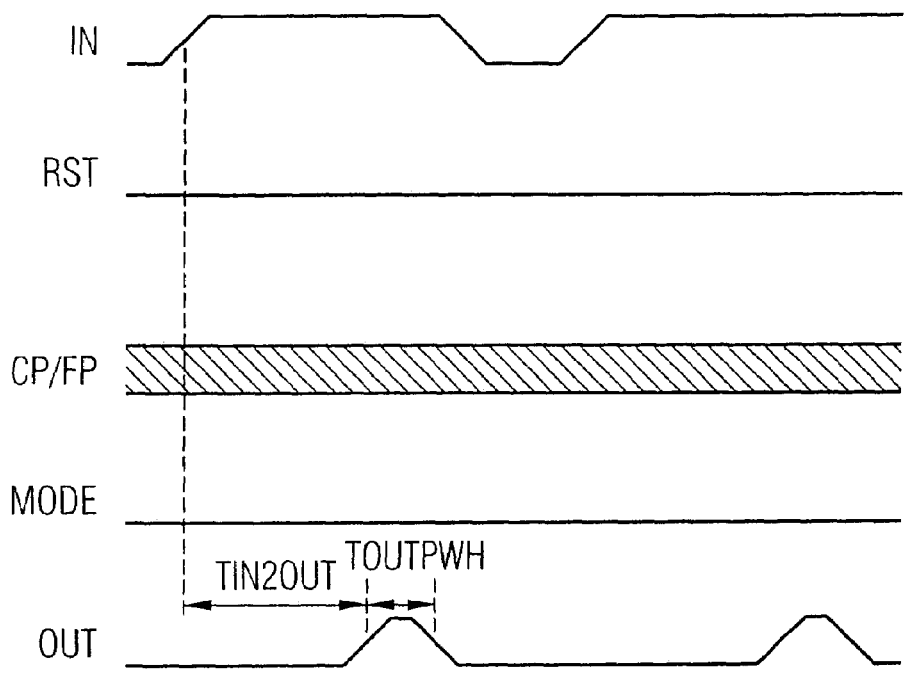
FIG. 2 shows signal waveforms for illustrating the method of operation of the exemplary embodiments of the delay circuit according to the invention in the delay mode.

In FIG. 2, signal waveforms are shown that illustrate the method of operation of the programmable delay circuit 1 in the delay mode.

In the delay mode, the control input MODE is on a logical low level. A clock signal as shown in the first line of FIG. 2 is generated by an external clock and feeds the signal input IN. The flip-flop FF1 is sensitive to rising commutations of its clock input, meaning the flip-flop FF1 samples the data at its input D when a rising commutation at its clock input occurs. Thus, only at a rising edge of the clock signal feeding the signal input IN the flip-flop FF1 switches its output Q to a logical high level. (Normally the output Q is on a logical low level.) Because of the feedback circuit connecting the output Q of the flip-flop FF1 to its reset input, the output Q is switched back to a logical low level after a time determined by the delay cell D1. For example, this time delay, which is denoted as TOUTPWH in FIG. 2, is 300 ps. Thus, a pulse with a width of 300 ps is passed on to the two delay stages.

The first delay stage imposes a coarse time delay on the pulse and the second delay stage imposes a fine time delay on the pulse. The delay times can be adjusted by inputting appropriate data to the control inputs CP and FP, respectively. The decoders DEC1 and DEC2 then drive the multiplexers MUX2 and MUX3 accordingly.

Finally the pulse generated by the flip-flop FF1 is outputted from the programmable delay stage 1 on the output OUT. At that time the pulse is delayed with a time delay TIN2OUT referred to the time the rising edge of the clock signal fed the signal input IN.

There are three different delays contributing to the time delay TIN2OUT: the delay caused by the multiplexer MUX1, the delay caused by the flip-flop FF1 and the delay caused by the two delay stages. The delays caused by the multiplexer MUX1 and the flip-flop FF1 are fixed, whereas the settings of the two delay stages are programmable via the control inputs CP and FP, thus making the time delay TIN2OUT programmable.

The reset signal feeding the control input RST allows to reset the flip-flop FF1 from outside and to stop the generation of the output signal. While the programmed delay circuit 1 is operated in the delay mode, the reset signal must be on a logical low level.

The delay cells D21, D22, D23, D24, D31, D32, D33 and D34 can also be reset by the reset signal (not shown).

In the following, the method of operation of the programmable delay circuit 1 in the cycle mode is described.

For starting the oscillation of the output signal, the control input RST must be on a logical low level. At the beginning, the control input MODE must also be on a logical low level so that the clock input of the flip-flop FF1 is connected to the external clock via the signal input IN. Thus, a signal with a rising edge can feed the clock input of the flip-flop FF1. Then, the control input MODE is switched to a logical high level and remains there during the cycle mode. Triggering the flip-flop FF1 once allows the programmable delay circuit 1 to output a delayed signal on its output OUT. This delayed signal is fed back via the feedback circuit into the clock input of the flip-flop FF1 and thus creates another delayed signal on the output OUT. The time difference TCYC between these two output signals equals the total time delay caused by the multiplexer MUX1, the flip-flop FF1 and the two delay stages. Assuming the settings of the two delay stages are the same during delay mode and cycle mode, the cycle time TCYC in the cycle mode equals the time delay TIN2OUT in the delay mode.

In both operation modes, i.e., the delay mode and the cycle mode, the settings of the decoders DEC1 and DEC2 given by the data feeding the control inputs CP and FP should be fixed during the generation of a delayed signal.

Figure 3:
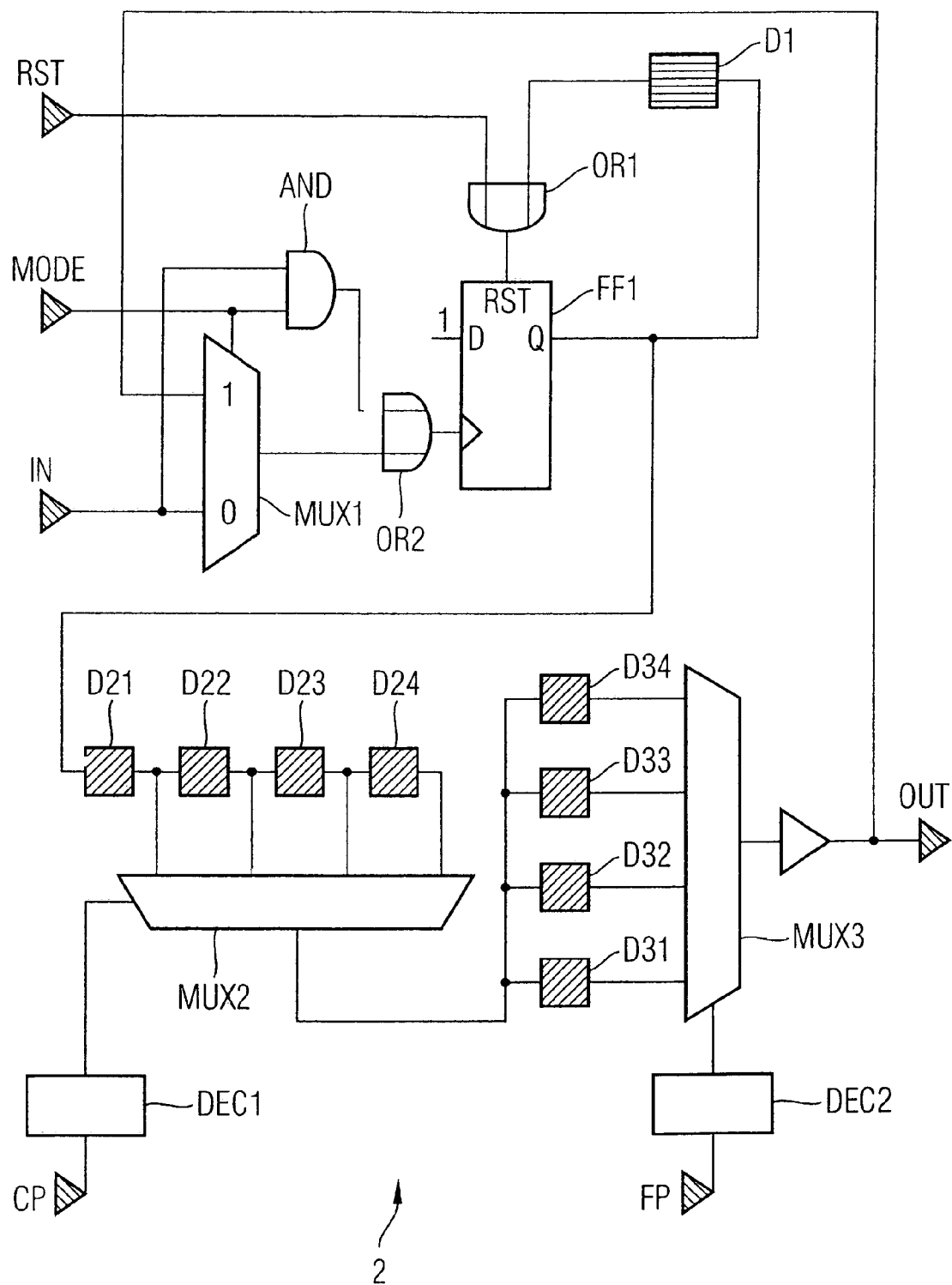
FIG. 3 shows a second exemplary embodiment of the delay circuit according to the invention.

FIG. 3 shows the circuit diagram of a programmable delay circuit 2 as a second exemplary embodiment of the invention. Most components of the programmable delay circuit 2 are identical with the corresponding components of the programmable delay circuit 1 shown in FIG. 1. Additionally the programmable delay circuit 2 comprises an AND gate AND and an OR gate OR2.

The inputs of the AND gate AND are connected to the signal input IN and the control input MODE, respectively. The inputs of the OR gate OR1 are connected to the output of the AND gate AND and the output of the multiplexer MUX1, respectively. The output of the OR gate OR2 feeds the clock input of the flip-flop FF1.

In delay mode, the operation of the programmable delay circuit 2 is identical with the operation of the programmable delay circuit 1 as described above because the AND gate AND and the OR gate OR2 do not interfere with the signal passing through the signal input IN. In cycle mode, the control input MODE is on a logical high level. The first rising edge starting the oscillation must be produced by a signal feeding the signal input IN. This rising edge reaches the clock input of the flip-flop FF1 via the AND gate AND and the OR gate OR2. Thereafter, the signal on the signal input IN must remain at 0.

Figure 4:
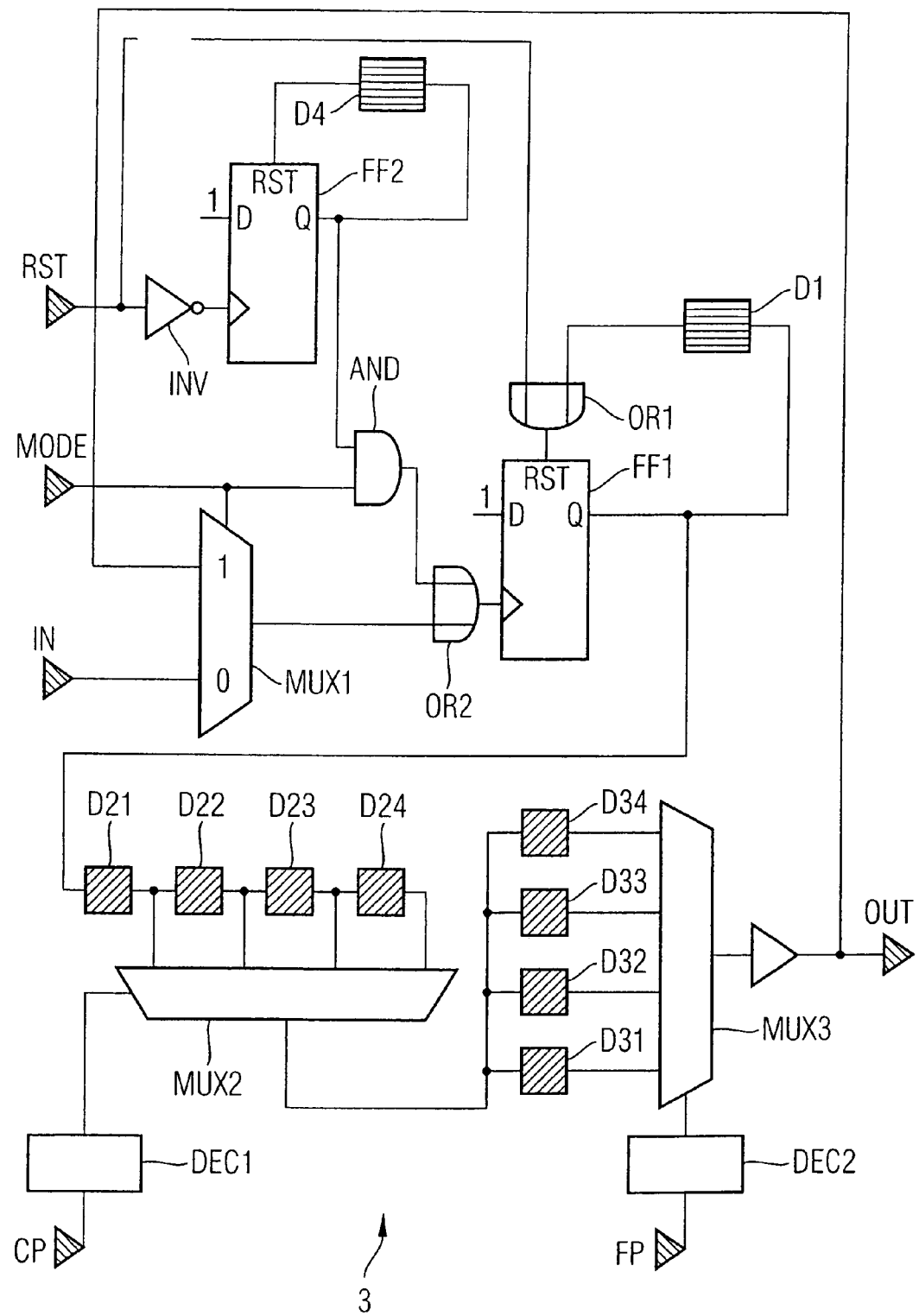
FIG. 4 shows a third exemplary embodiment of the delay circuit according to the invention.

FIG. 4 shows the circuit diagram of a programmable delay circuit 3 as a third exemplary embodiment of the invention. The programmable delay circuit 3 comprises all the components of the programmable delay circuit 2 depicted in FIG. 3. However, the connection of one of the inputs of the AND gate AND is different in FIG. 4. This input that is connected to the signal input IN shown in FIG. 3 is now connected to an output Q of a flip-flop FF2. The clock input of the flip-flop FF2 is connected to the control input RST via an inverter INV. The flip-flop FF2 also exhibits a feedback circuit feeding its output Q back to its reset input via a delay cell D4.

Figure 5:
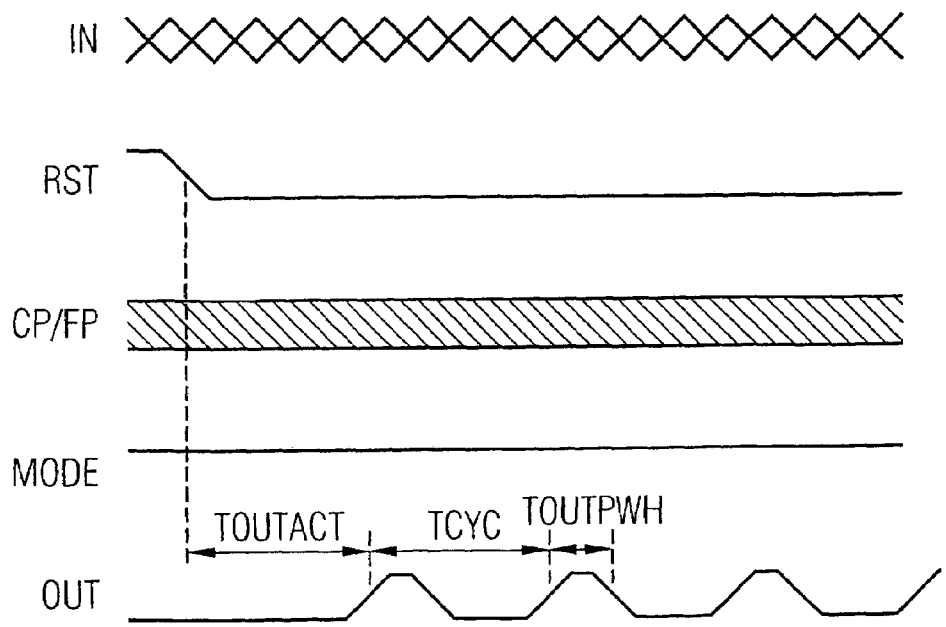
FIG. 5 shows signal waveforms for illustrating the method of operation of the third exemplary embodiment of the delay circuit according to the invention in the cycle mode.

The programmable delay circuit 3 operates in the delay mode as described above and as shown in FIG. 2. In FIG. 5, signal waveforms are shown that illustrate the method of operation of the programmable delay circuit 3 in the cycle mode. In the cycle mode, the control input MODE is on a logical high level.

The operation of the programmable delay circuit 3 in the cycle mode differs from the operation of the programmable delay circuits 1 and 2. For starting the oscillation in cycle mode, the signal on the control input RST is switched from a logical high level to a logical low level as shown in FIG. 5. Because of the inverter INV, a rising edge then arrives at the clock input of the flip-flop FF2 and causes the flip-flop FF2 to switch its output Q from a logical low level to a logical high level. Since the control input MODE is on a high logical level, the signal created by the flip-flop FF2 can pass the AND gate AND and its rising edge causes the flip-flop FF1 to create another signal on its output Q, which reaches the output OUT a time TOUTACT after the falling edge of the signal on the control input RST.

The output Q of the flip-flop FF2 goes back to a logical low level after a period of time given by the delay cell D4. As long as the control input RST remains on a logical low level, the output Q of the flip-flop FF2 also remains on a logical low level.

However, since the control input MODE is on a logical high level, the pulse created by the flip-flop FF1 is able to pass the multiplexer MUX1 and causes the flip-flop FF1 to create another pulse. As can be seen from FIG. 5, these pulses appear on the output OUT with a period TCYC.

For stopping the generation of pulses on the output OUT, the control input RST is switched back to a logical high level. This setting does not allow the flip-flop FF1 any more to switch its output Q to a logical high level.

In the cycle mode, the signal input IN is completely decoupled from the programmable delay circuit 3. Therefore, the signal input IN can be fed with any signal during cycle mode as shown in FIG. 5. This is advantageous over the programmable delay circuits 1 and 2 because the programmable delay circuits 1 and 2 require a certain behaviour of the signal input IN and the control input MODE during the cycle mode.

While the foregoing is directed to embodiments of the present invention, other and further embodiments of the invention may be devised without departing from the basic scope thereof, and the scope thereof is determined by the claims that follow.

What is claimed is:

1. A delay circuit, comprising:
   a signal generator having a control terminal for receiving a trigger signal and having an output terminal for outputting a signal when receiving the trigger signal with a pre-determined characteristic;
   a delay component having an input terminal for receiving the signal outputted by the signal generator and having an output terminal for generating an output signal delayed with a time delay corresponding to the time the delay component received the signal outputted by the signal generator; and
   a feedback circuit connecting the output terminal of the delay component to the control terminal of the signal generator, wherein the feedback circuit of the delay circuit comprises a multiplexer comprising:
      a first input terminal connected to the output terminal of the delay component, wherein the first input terminal of the multiplexer of the feedback circuit is directly connected to the output terminal of the delay component;
      a second input terminal fed by an input signal; and
      an output terminal connected to the control terminal of the signal generator.

2. The delay circuit of claim 1, wherein the signal generator is a pulse generator which outputs a pulse on its output terminal when the trigger signal with the pre-determined characteristic is received on its control terminal.

3. The delay circuit of claim 1, wherein the signal generator is a sample-and-hold element having a control terminal for receiving the trigger signal, having an input terminal for sampling a pre-determined signal feeding the input terminal and having an output terminal for outputting the pre-determined signal when the trigger signal with the pre-determined characteristic is received.

4. The delay circuit of claim 3, wherein the sample-and-hold element comprises a feedback circuit connecting its output terminal to a reset terminal which resets the sample-and-hold element when the pre-determined signal is received.

5. The delay circuit of claim 4, wherein the feedback circuit of the sample-and-hold element comprises a further delay component.

6. The delay circuit of claim 5, wherein the sample-and-hold element comprises a flip-flop.

7. The delay circuit of claim 1, wherein the pre-determined characteristic of the trigger signal is one of a rising edge and a falling edge.

8. The delay circuit of claim 1, wherein the time delay generated by the delay component is programmable.

9. A delay circuit, comprising:
   a signal generator having a control terminal for receiving a trigger signal and having an output terminal for outputting a signal when receiving the trigger signal with a pre-determined characteristic;
   a delay component having an input terminal for receiving the signal outputted by the signal generator and having an output terminal for generating an output signal delayed with a time delay corresponding to the time the delay component received the signal outputted by the signal generator, wherein the delay component comprises a plurality of delay stages connected in series, and wherein the delay stages delay the signal received on their input terminals with one of a coarse delay and a fine delay, respectively; and
   a feedback circuit connecting the output terminal of the delay component to the control terminal of the signal generator, wherein the feedback circuit of the delay circuit comprises a multiplexer having a first input terminal connected to the output terminal of the delay component, having a second input terminal fed by an input signal and having an output terminal connected to the control terminal of the signal generator.

10. A delay circuit, comprising:
    a signal generator having a control terminal for receiving a trigger signal and having an output terminal for outputting a signal when receiving the trigger signal with a pre-determined characteristic;
    a delay component having an input terminal for receiving the signal outputted by the signal generator and having an output terminal for generating an output signal delayed with a time delay corresponding to the time the delay component received the signal outputted by the signal generator; and
    a feedback circuit connecting the output terminal of the delay component to the control terminal of the signal generator, wherein the feedback circuit of the delay circuit comprises a multiplexer having a first input terminal connected to the output terminal of the delay component, having a second input terminal fed by an input signal and having an output terminal connected to the control terminal of the signal generator, and wherein the multiplexer has a control terminal fed with a control signal for switching operation between a delay mode and a cycle mode.

11. The delay circuit of claim 10, further comprising:
    an AND gate having a first input terminal fed with the input signal, a second input terminal connected to the control terminal of the multiplexer and an output terminal; and
    an OR gate having a first input terminal connected to the output terminal of the AND gate, a second input terminal connected to the output terminal of the multiplexer and having an output terminal connected to the control terminal of the signal generator.

12. The delay circuit of claim 10, further comprising:
an AND gate having a first input terminal fed with a start/stop signal, a second input terminal connected to the control terminal of the multiplexer and an output terminal; and
an OR gate having a first input terminal connected to the output terminal of the AND gate, a second input terminal connected to the output terminal of the multiplexer and an output terminal connected to the control terminal of the signal generator.

13. The delay circuit of claim 12, further comprising:
a further sample-and-hold element comprising:

a control terminal for receiving a reset signal;
an input terminal for sampling a pre-determined signal feeding the input terminal;
an output terminal for outputting the pre-determined signal when the reset signal is received, wherein the output terminal of the further sample-and-hold element is connected to the first input terminal of the AND gate; and
a feedback circuit comprising a further delay component, the feedback circuit connecting its output terminal with a reset terminal, which resets the sample-and-hold element when the pre-determined signal is received.

* * * * *